(12) United States Patent
Griffin et al.

(10) Patent No.: US 7,674,148 B2
(45) Date of Patent: Mar. 9, 2010

(54) SHADOW MASK TENSIONING METHOD

(76) Inventors: Todd R. Griffin, 343 State St., Rochester, NY (US) 14650; Thomas W. Palone, 343 State St., Rochester, NY (US) 14650

( * ) Notice: Subject to any disclaimer, the term of this patent is extended or adjusted under 35 U.S.C. 154(b) by 1064 days.

(21) Appl. No.: 11/352,186

(22) Filed: Feb. 10, 2006

(65) Prior Publication Data
US 2007/0190888 A1 Aug. 16, 2007

(51) Int. Cl.
*H01J 9/236* (2006.01)
(52) U.S. Cl. .......................... 445/30; 445/37
(58) Field of Classification Search ................ 313/407, 313/408, 402; 445/37, 68, 30; 29/557
See application file for complete search history.

(56) References Cited

U.S. PATENT DOCUMENTS 4,772,238 A * 9/1988 Horn et al. ............... 445/30
4,894,037 A * 1/1990 Fendley et al. ........... 445/30
6,566,798 B2 * 5/2003 Watanabe et al. ........... 313/407
6,577,051 B2 * 6/2003 Kwon et al. ................ 313/407

FOREIGN PATENT DOCUMENTS

EP 2 063 320 A2 11/2008

\* cited by examiner

*Primary Examiner*—Joseph L Williams
*Assistant Examiner*—Elmito Breval
(74) *Attorney, Agent, or Firm*—Morgan, Lewis & Bockius LLP

(57) ABSTRACT

A method for tensioning a shadow mask includes positioning a first side of a shadow mask into contact with the lower half of a tensioning frame, positioning an upper half of the tensioning frame into contact with a second side of the shadow mask, and clamping the upper half of the tensioning frame to the lower half of the tensioning frame to form a tensioning frame, and rigidly clamping the shadow mask between the two tensioning frame halves. The method also includes elevating the temperature of the tensioning frame to tension the shadow mask.

5 Claims, 2 Drawing Sheets

SHADOW MASK TENSIONING METHOD

FIELD OF INVENTION

This invention relates to patterned physical vapor deposition. More specifically, this invention relates to providing uniform tension in a shadow mask.

BACKGROUND OF THE INVENTION

Physical vapor deposition (PVD) is a useful technique for producing thin films, enabling the fabrication of devices such as organic light emitting diodes (OLEDs) and photovoltaic devices ("solar cells"). Shadow masks are used to pattern the thin films during the deposition process. In general, there is a need for precision alignment between the various layers deposited in the fabrication of complex, layered structures such as OLEDs. Providing uniform tension in the shadow mask is an essential contributor to enabling precision alignment, especially in designs that use multiple shadow masks.

Existing methods for tensioning a shadow mask rely primarily on mechanisms in which clamp bars are affixed to the edges of the shadow mask and forces are applied to these clamp bars via pneumatic, hydraulic, or mechanical actuators. These existing methods for tensioning are difficult to control in a manner that results in uniform tension within the tensioned shadow mask. The portion of the mask which is in direct contact with the clamp bars cannot stretch, and therefore introduce non-uniformities in the mask tension. This is inherent in the use of clamping bars to tension the mask. Non-uniform tension leads to deformations within the mask, which contains a larger number of openings, often with very tight tolerances. The existing methods rely on mechanisms with moving parts, sometimes with complex controls, and are subject to a wide variety of failure mechanisms.

Thin film devices, such as OLED displays or photovoltaic cells, compete in the market with devices made using other technologies. In order to compete with other technologies, patterned thin film devices require more uniform and lower cost methods for tensioning shadow masks.

SUMMARY OF THE INVENTION

It is an object of this invention to provide a way for tensioning shadows masks that is inexpensive and provides highly uniform tension in the mounted shadow mask.

These objects are achieved by a method for tensioning a shadow mask comprising:

a) positioning a first side of a shadow mask into contact with the lower half of a tensioning frame;

b) positioning an upper half of the tensioning frame into contact with a second side of the shadow mask;

c) clamping the upper half of the tensioning frame to the lower half of the tensioning frame to form a tensioning frame, rigidly clamping the shadow mask between the two tensioning frame halves;

d) elevating the temperature of the tensioning frame, causing the tensioning frame to expand and place the shadow mask in tension;

e) positioning a lower half of a mounting frame into contact with the first side of the shadow mask in the tensioning frame while the tensioning frame is at an elevated temperature;

f) positioning an upper half of the mounting frame into contact with the second side of the shadow mask while the tensioning frame is at an elevated temperature;

g) clamping the upper half of the mounting frame to the lower half of the mounting frame, rigidly clamping the shadow mask between the two mounting frame halves while the tensioning frame is at an elevated temperature; and h) unclamping the upper tensioning frame half from the lower tensioning frame half and removing the upper and lower tensioning frame halves while the tensioning frame is at an elevated temperature.

ADVANTAGEOUS EFFECT OF THE INVENTION

The shadow mask tensioning method of this invention has the advantage that it produces extremely uniform tension throughout the entire mask. It has the further advantage that the equipment required to by the invention is mechanically quite simple and is therefore low cost to make, requires virtually no maintenance or calibration, and is extremely reliable in operation.

DETAILED DESCRIPTION OF THE INVENTION

Figure 1:
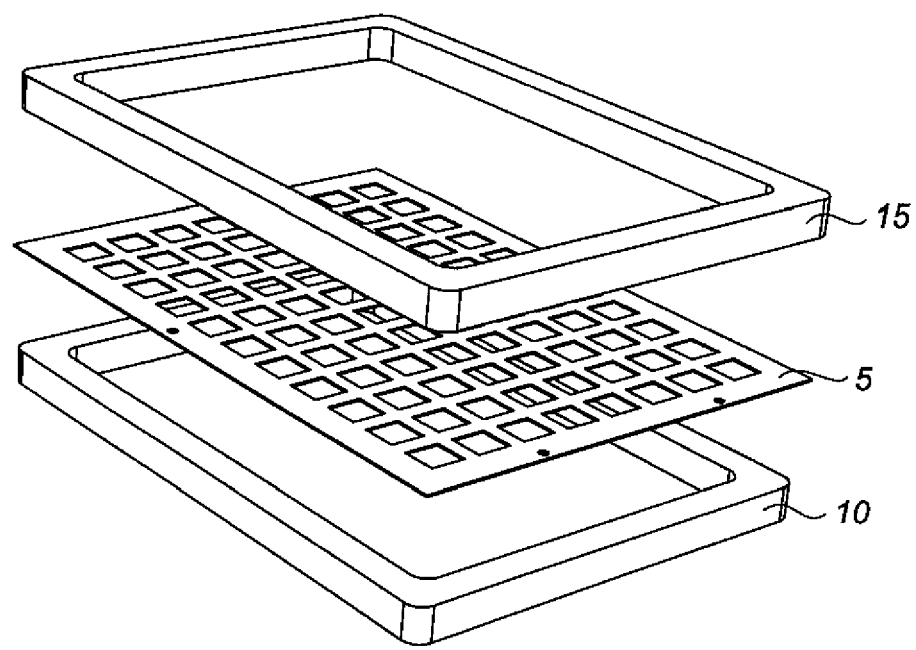
FIG. 1 shows the initial sequence for tensioning a shadow mask in accordance with the present invention.
Figure 2:
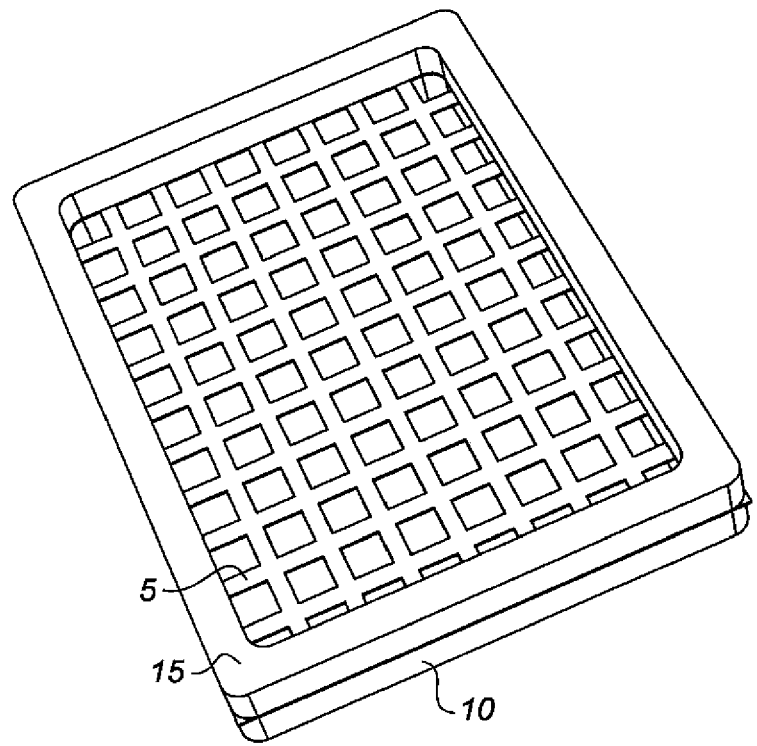
FIG. 2 shows the assembled tension frame and shadow mask.

Referring to FIG. 1, one side of a shadow mask 5 is brought into contact with the tension frame lower half 10. The tension frame upper half 15 is then brought into contact with the second side of the shadow mask 5. FIG. 2 shows the assembled shadow mask and upper and lower tension frame halves. The two tension frame halves are then rigidly clamped together. There are any number of ways available to achieve this clamping that are well known to those of ordinary skill in the art and include bolts, external clamps, magnets/electromagnets, and lever action mechanisms.

Once the two tension frame halves are clamped together, they are heated to an elevated temperature, causing them to expand and tension the shadow mask 5. The heat for this process can be from external heat sources such as induction coils, infrared radiant heaters or contact electrical heaters, or it can be from an internal heat source embedded within the frame, such as an embedded or internal electric cartridge style heater, or a channel carrying flowing hot water through the tension frame halves.

The tension frame halves are made from a material exhibiting high strength, high thermal conductivity, and a high coefficient of thermal expansion. Carbon steel is an example of such a material. The strength is required to be able to tension the shadow mask. The high coefficient of thermal expansion is important because the tension in the shadow mask is produced by heating the tension frame and forcing it to expand, pulling the clamped edges of the shadow mask with it. The high coefficient of thermal expansion provides for increased tension for the same change in temperature. High thermal conductivity increases the uniformity of the expansion of the frame and hence the tension in the mask. Carbon steel is an example of a material suitable for the making of the tension frame. Unlike current tensioning methods where the clamping bars introduce non-uniformities in mask tension, in an appropriately designed embodiment the portion of the mask in contact with the tension frame will experience no non-uniformities in tension since the frame expands proportionately in all directions.

Figure 3:
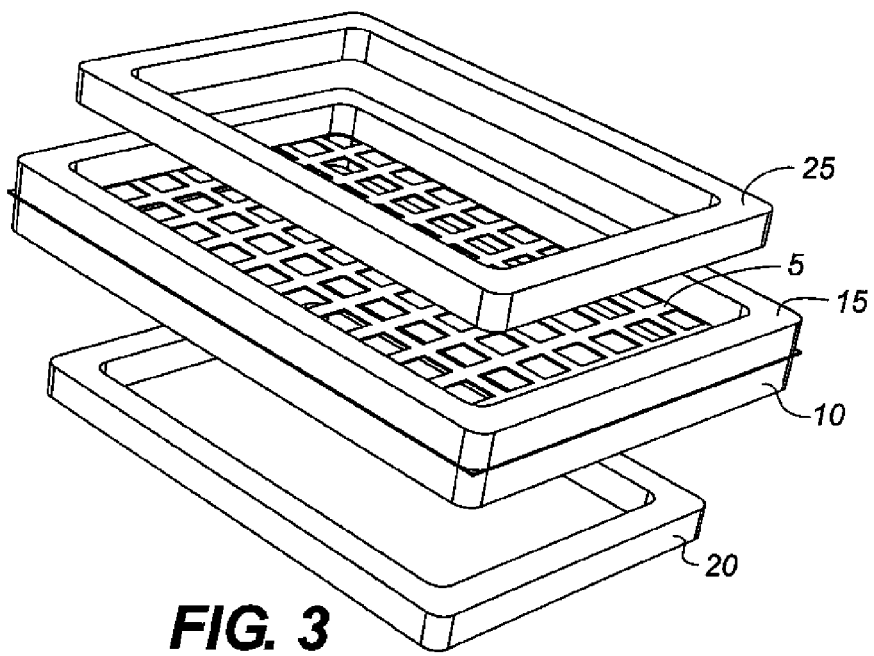
FIG. 3 shows the adding of the mounting frame.
Figure 4:
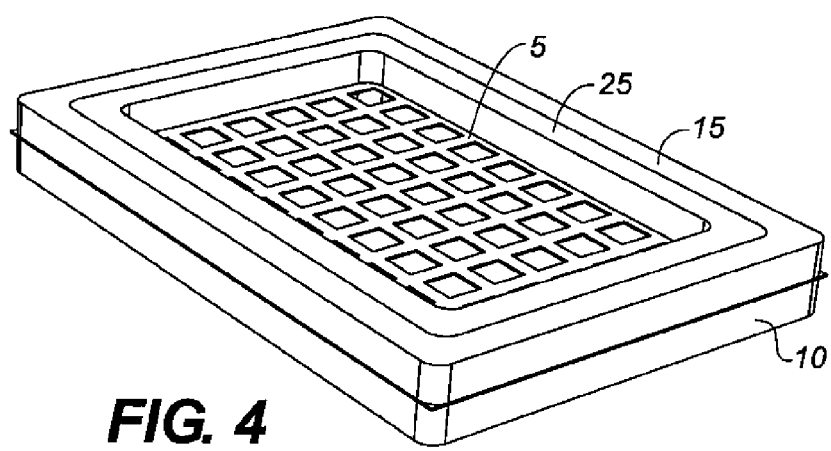
FIG. 4 shows the assembled mounting frame in position with the tension frame.

Referring to FIG. 3, once the tension frame has reached the desired elevated temperature, and consequently the shadow mask has reached the desired tension, a lower mounting frame half 20 is brought into contact with a first side of the shadow mask 5, and an upper mounting frame half 25 is brought into contact with a second side of the shadow mask while the tensioning frame is at an elevated temperature. Once the mounting frame halves are in contact with the shadow mask as shown in FIG. 4, the mounting frame halves are clamped together by any clamping arrangement such as screws, rigidly locking the shadow mask between them while the tensioning frame is at an elevated temperature. The available clamping mechanisms are the same as for the tension frame halves. Most preferably the mounting frame halves are made of a material exhibiting a low coefficient of thermal expansion. When the mounting frame halves are not made of such materials, it can be desirable to thermally isolate the mounting frame from the hot tension frame. This can be done by incorporating insulating material into the construction of the mounting frame halves, into the construction of the tension frame halves, or by interposing insulating material between the mounting frame halves and the tension frame halves.

Figure 5:
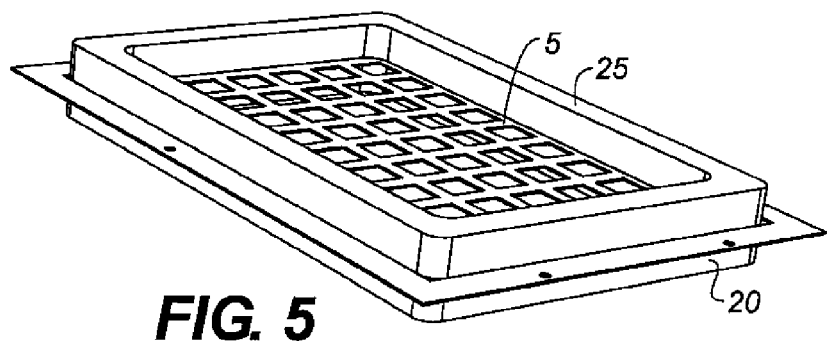
FIG. 5 shows the mounting frame and shadow mask after removing the tension frame.

Referring to FIG. 5, the tension frame halves are unclamped and removed while the tensioning frame is at an elevated temperature. This process provides an assembly of the shadow mask 5 and the clamped upper mounting frame half 25 and the lower mounting frame half 20, where the shadow mask is now held in uniform tension between the two clamped mounting frame halves.

In a preferred embodiment the shadow mask is made of a material exhibiting a low coefficient of thermal expansion so that it does not change size when the tension frame is heated. When the shadow mask cannot be made of such material, it is desirable to keep the shadow mask cool through passive means, such as a large thermally conductive heat sink plate. The top surface of this heat sink plate can be positioned beneath the shadow mask coplanar with the top surface of the tension frame lower half. The heat sink plate can be cooled by active means, such as a stream of cooling air or water.

In the preferred embodiment the tension frame halves are larger in perimeter than the mounting frame halves. This provides the most uniform shadow mask tension transfer to the mounting frame halves. An alternate embodiment of the present invention has the tension frame halves with a smaller perimeter inside the mounting frame halves. In this configuration, however, the outer shadow mask edges are clamped between the mounting frame halves under no tension. When the tension frame halves are unclamped, a portion of the induced shadow mask tension is lost to the previously untensioned shadow mask edges.

Although the invention has been described in terms of upper and lower mounting frame halves and upper and lower tension frame halves, it is understood that the invention can in fact be carried out in any orientation and the notion of upper and lower is strictly symbolic. In particular, the invention can be carried out in a vertical orientation in which the normal to the face of the shadow mask is perpendicular to the direction of the gravity vector. Furthermore, the figures depict the tension frame halves and mounting frame halves as solid continuous members. However, each of these frame half types may be built up of multiple components prior to shadow mask tensioning or in the process of tensioning the shadow mask during clamping. Particular attention to the frame corner rigidity is required for successful implementation.

The invention has been described in detail with particular reference to certain preferred embodiments thereof, but it will be understood that variations and modifications can be effected within the spirit and scope of the invention.

PARTS LIST 5 shadow mask
10 tension frame lower half
15 tension frame upper half
20 lower mounting frame half
25 upper mounting frame half

The invention claimed is:

1. A method for tensioning a shadow mask comprising:
   a) positioning a first side of a shadow mask into contact with the lower half of a tensioning frame;
   b) positioning an upper half of the tensioning frame into contact with a second side of the shadow mask;
   c) clamping the upper half of the tensioning frame to the lower half of the tensioning frame to form a tensioning frame, rigidly clamping the shadow mask between the two tensioning frame halves;
   d) elevating the temperature of the tensioning frame, causing the tensioning frame to expand and place the shadow mask in tension;
   e) positioning a lower half of a mounting frame into contact with the first side of the shadow mask in the tensioning frame while the tensioning frame is at an elevated temperature, where the tensioning frame is larger that mounting frame;
   f) positioning an upper half of the mounting frame into contact with the second side of the shadow mask while the tensioning frame is at an elevated temperature;
   g) clamping the upper half of the mounting frame to the lower half of the mounting frame, rigidly clamping the shadow mask between the two mounting frame halves while the tensioning frame is at an elevated temperature; and
   h) unclamping the upper tensioning frame half from the lower tensioning frame half and removing the upper and lower tensioning frame halves while the tensioning frame is at an elevated temperature.

2. The method according to claim 1 where one or both halves of either or both of the tensioning frame or the mounting frame include multiple components which are assembled as they are brought sequentially into contact with the shadow mask.

3. A method for tensioning a shadow mask comprising:
   a) positioning a first side of a shadow mask into contact with the lower half of a tensioning frame;
   b) positioning an upper half of the tensioning frame into contact with a second side of the shadow mask;
   c) clamping the upper half of the tensioning frame to the lower half of the tensioning frame to form a tensioning frame, rigidly clamping the shadow mask between the two tensioning frame halves where the tensioning frame contains an internal heat source;
   d) elevating the temperature of the tensioning frame using the internal heat source to cause the tensioning frame to expand and place the shadow mask in tension;
   e) positioning a lower half of a mounting frame into contact with the first side of the shadow mask in the tensioning frame while the tensioning frame is at an elevated temperature;

f) positioning an upper half of the mounting frame into contact with the second side of the shadow mask while the tensioning frame is at an elevated temperature;

g) clamping the upper half of the mounting frame to the lower half of the mounting frame, rigidly clamping the shadow mask between the two mounting frame halves while the tensioning frame is at an elevated temperature; and h) unclamping the upper tensioning frame half from the lower tensioning frame half and removing the upper and lower tensioning frame halves while the tensioning frame is at an elevated temperature.

4. A method for tensioning a shadow mask comprising:

a) positioning a first side of a shadow mask into contact with the lower half of a tensioning frame;

b) positioning an upper half of the tensioning frame into contact with a second side of the shadow mask;

c) clamping the upper half of the tensioning frame to the lower half of the tensioning frame to form a tensioning frame, rigidly clamping the shadow mask between the two tensioning frame halves;

d) positioning a heat sink into contact with the shadow mask and then elevating the temperature of the tensioning frame elevating the temperature of the tensioning frame, causing the tensioning frame to expand and place the shadow mask in tension;

e) positioning a lower half of a mounting frame into contact with the first side of the shadow mask in the tensioning frame while the tensioning frame is at an elevated temperature, where the tensioning frame is larger than the mounting frame;

f) positioning an upper half of the mounting frame into contact with the second side of the shadow mask while the tensioning frame is at an elevated temperature;

g) clamping the upper half of the mounting frame to the lower half of the mounting frame, rigidly clamping the shadow mask between the two mounting frame halves while the tensioning frame is at an elevated temperature; and h) unclamping the upper tensioning frame half from the lower tensioning frame half and removing the upper and lower tensioning frame halves while the tensioning frame is at an elevated temperature.

5. A method for tensioning a shadow mask comprising:

a) positioning a first side of a shadow mask into contact with the lower half of a tensioning frame;

b) positioning an upper half of the tensioning frame into contact with a second side of the shadow mask;

c) clamping the upper half of the tensioning frame to the lower half of the tensioning frame to form a tensioning frame, rigidly clamping the shadow mask between the two tensioning frame halves;

d) elevating the temperature of the tensioning frame, causing the tensioning frame to expand and place the shadow mask in tension;

e) positioning a lower half of a mounting frame into contact with the first side of the shadow mask in the tensioning frame while the tensioning frame is at an elevated temperature, where the tensioning frame is larger than the mounting frame;

f) positioning an upper half of the mounting frame into contact with the second side of the shadow mask while the tensioning frame is at an elevated temperature;

g) directing the flow of a cooling fluid over the shadow mask and then clamping the shadow mask between the two halves of the mounting frame, clamping the upper half of the mounting frame to the lower half of the mounting frame, rigidly clamping the shadow mask between the two mounting frame halves while the tensioning frame is at an elevated temperature; and h) unclamping the upper tensioning frame half from the lower tensioning frame half and removing the upper and lower tensioning frame halves while the tensioning frame is at an elevated temperature.

* * * * *